US011195875B2

(12) United States Patent
Lin et al.

(10) Patent No.: US 11,195,875 B2
(45) Date of Patent: Dec. 7, 2021

(54) X-RAY DETECTING PANEL AND METHOD OF OPERATING THE SAME, AND X-RAY DETECTING DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jian Lin, Beijing (CN); Yong Zhang, Beijing (CN); Gang Hua, Beijing (CN); Haobo Fang, Beijing (CN); Limin Zhang, Beijing (CN); Lu Bai, Beijing (CN); Lei Mi, Beijing (CN); Zhiying Bao, Beijing (CN); Yanna Xue, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/541,327

(22) Filed: Aug. 15, 2019

(65) Prior Publication Data
US 2020/0058699 A1 Feb. 20, 2020

(30) Foreign Application Priority Data

Aug. 15, 2018 (CN) .......................... 201810928927.X

(51) Int. Cl.
*H01L 27/146* (2006.01)

(52) U.S. Cl.
CPC .. *H01L 27/14663* (2013.01); *H01L 27/14603* (2013.01); *H01L 27/14605* (2013.01); *H01L 27/14612* (2013.01); *H01L 27/14614* (2013.01)

(58) Field of Classification Search
CPC .... H01L 27/1214–1296; H01L 27/144–14893
See application file for complete search history.

(56) References Cited

U.S. PATENT DOCUMENTS

2011/0204372 A1* 8/2011 Suzuki ................ G02F 1/13624
257/59
2016/0178763 A1* 6/2016 Okada ................ H01L 31/0272
250/370.09

(Continued)

FOREIGN PATENT DOCUMENTS

CN 102933146 A 2/2013
CN 103765589 A 4/2014

(Continued)

OTHER PUBLICATIONS

Office Action dated May 14, 2020 issued in corresponding Chinese Application No. 201810928927.X.

*Primary Examiner* — Selim U Ahmed
*Assistant Examiner* — Evan G Clinton
(74) *Attorney, Agent, or Firm* — Nath, Goldberg & Meyer; Joshua B. Goldberg

(57) ABSTRACT

An X-ray detecting panel and a method of operating the same, and an x-ray detecting device are provided. The X-ray detecting panel includes an array substrate which includes a plurality of gate lines and a plurality of signal lines intersecting with each other to divide the array substrate into a plurality of photosensitive cells, each of which comprises a thin film transistor, and the plurality of photosensitive cells comprises one or more first photosensitive cells and one or more second photosensitive cells, the thin film transistor of (Continued)

the first photosensitive cell is disposed at a first side of the first photosensitive cell, the thin film transistor of the second photosensitive cell is disposed at a second side of the second photosensitive cell, and the first side is opposite to the second side.

18 Claims, 4 Drawing Sheets

(56) References Cited

U.S. PATENT DOCUMENTS

| | | | |
|---|---|---|---|
| 2016/0380019 A1* | 12/2016 | Yang | H01L 27/1222 |
| | | | 438/59 |
| 2017/0023682 A1* | 1/2017 | Liu | H01L 27/1469 |
| 2020/0161366 A1* | 5/2020 | Wojcik | H01L 27/14632 |

FOREIGN PATENT DOCUMENTS

| | | |
|---|---|---|
| CN | 104685629 A | 6/2015 |
| CN | 109087925 A | 12/2018 |
| JP | 2003-255049 A | 9/2003 |

* cited by examiner sequentially supply a first scanning signal to the plurality of gate lines such that the thin film transistor electrically connected to a gate line to which the first scanning signal is applied is turned on, apply a positive voltage through the signal line to the cathode of the photodiode electrically connected to the turned-on thin film transistor by the image signal processing circuit, and charge an equivalent capacitor formed by the cathode and the anode of the photodiode to a reference voltage ~P1 sequentially supply a second scanning signal to the plurality of gate lines such that the thin film transistor electrically connected to a gate line to which the second scanning signal is applied is turned off to cause photogenerated charge generated under irradiation by the photodiode electrically connected to the turned-off thin film transistor drift under an effect of the bias voltage such that the bias voltage across the photodiode is reduced ~P2 sequentially supply the first scanning signal to the plurality of gate lines again such that the thin film transistor electrically connected to the gate line to which the first scanning signal is applied is turned on, and charge the equivalent capacitor formed by the cathode and the anode of the photodiode electrically connected to the turned-on thin film transistor to the reference voltage by the image signal processing circuit ~P3

Fig. 5

X-RAY DETECTING PANEL AND METHOD OF OPERATING THE SAME, AND X-RAY DETECTING DEVICE

CROSS-REFERENCE TO RELATED APPLICATIONS

This application claims the priority to the Chinese patent application No. 201810928927.X filed on Aug. 15, 2018, the disclosure of which is incorporated herein by reference in its entirety.

TECHNICAL FIELD

The present disclosure relates to the field of X-ray detection, and more particularly relates to an X-ray detecting panel and a method of operating the same, and an X-ray detecting device including the X-ray detecting panel.

BACKGROUND

With the popularity of digital medical treatment, X-ray flat panel detectors have become commonly used X-ray detectors in medical devices.

However, a partial "whitening" or "blackening" phenomenon may occur in an image displayed using detection signals detected by a current X-ray flat panel detector, and thus professionals (for example, doctors) are disturbed when using the displayed image for diagnosis.

SUMMARY

An embodiment of the present disclosure provides an X-ray detecting panel, including an array substrate. The array substrate includes a plurality of gate lines and a plurality of signal lines intersecting with the plurality of gate lines to divide the array substrate into a plurality of photosensitive cells. Each of the plurality of photosensitive cells is provided with a thin film transistor therein, the plurality of photosensitive cells comprises one or more first photosensitive cells and one or more second photosensitive cells, the thin film transistor of each of the first photosensitive cells is disposed at a first side of the first photosensitive cell, and the thin film transistor of each of the second photosensitive cells is disposed at a second side of the second photosensitive cell, and the first side is opposite to the second side. The X-ray detecting panel further includes a photosensitive element layer, the photosensitive element layer includes a plurality of photodiodes, and each of the plurality of photosensitive cells corresponds to one photodiode.

In some embodiments, a drain of the thin film transistor of the first photosensitive cell is disposed at the first side of the thin film transistor, and is electrically connected to a signal line at the first side of the thin film transistor and closest to the thin film transistor; and a drain of the thin film transistor of the second photosensitive cell is disposed at the second side of the thin film transistor, and is electrically connected to a signal line at the second side of the thin film transistor and closest to the thin film transistor.

In some embodiments, the X-ray detecting panel further includes an insulating layer covering the photosensitive element layer, and a plurality of bias voltage lines on the insulating layer. A source of the thin film transistor in each of the photosensitive cells is electrically connected to a cathode of the photodiode corresponding to the photosensitive cell, and a bias voltage line corresponding to the photosensitive cell is electrically connected to an anode of the photodiode corresponding to the photosensitive cell through a via hole in the insulating layer corresponding to the photosensitive cell.

In some embodiments, the plurality of photosensitive cells are arranged in rows and columns, and each column of at least one column of the photosensitive cells comprises at least one of the first photosensitive cells and at least one of the second photosensitive cells, the thin film transistor of the first photosensitive cell is disposed at the left side of the first photosensitive cell and the thin film transistor of the second photosensitive cell is disposed at the right side of the second photosensitive cell, a drain of the thin film transistor disposed at the left side of the first photosensitive cell is disposed at the left side of the thin film transistor, and is electrically connected to a signal line at the left side of the thin film transistor and closest to the thin film transistor, and a drain of the thin film transistor disposed at the right side of the second photosensitive cell is disposed at the right side of the thin film transistor, and is electrically connected to a signal line at the right side of the thin film transistor and closest to the thin film transistor.

In some embodiments, in any two adjacent rows of photosensitive cells, the thin film transistors in one row of photosensitive cells are respectively disposed at the left side of the photosensitive cells comprising the thin film transistors, while the thin film transistors in the other row of photosensitive cells are respectively disposed at the right side of the photosensitive cells comprising the thin film transistors.

In some embodiments, the thin film transistors in odd rows of photosensitive cells are disposed at the right side of the photosensitive cells comprising the thin film transistors, and the thin film transistors in even rows of photosensitive cells are disposed at the left side of the photosensitive cells comprising the thin film transistors.

In some embodiments, the number of columns of the photosensitive cells is less than the number of the signal lines by one.

In some embodiments, the array substrate comprises 3072 gate lines and 3073 signal lines, such that the array substrate is divided into 3072×3072 photosensitive cells.

In some embodiments, the X-ray detecting panel further includes a scintillation layer disposed on a light incident side of the photosensitive element layer to convert X-rays into visible light.

In some embodiments, the scintillation layer includes gadolinium oxysulfide.

In some embodiments, the scintillation layer includes cesium iodide.

In some embodiments, the X-ray detecting panel further includes an image signal processing circuit, and the image signal processing circuit is electrically connected to the signal lines, receives detection signals from the photosensitive cells through the signal lines, and converts the received detection signals into an image signal.

An embodiment of the present disclosure further provides an X-ray detecting device, including: the X-ray detecting panel described above, and a display panel configured to display an image based on the image signal from the X-ray detecting panel.

An embodiment of the present disclosure further provides a method of operating the X-ray detecting panel described above, including: in a first stage, sequentially supplying a first scanning signal to the plurality of gate lines such that the thin film transistor electrically connected to a gate line to which the first scanning signal is applied is turned on, applying, by the image signal processing circuit, a positive voltage through the signal line to the cathode of the photodiode electrically connected to the turned-on thin film transistor, and charging an equivalent capacitor formed by the cathode and the anode of the photodiode to a reference voltage such that the photodiode has a bias voltage equal to the reference voltage; in a second stage, sequentially supplying a second scanning signal to the plurality of gate lines such that the thin film transistor electrically connected to a gate line to which the second scanning signal is applied are turned off, to cause photogenerated charge generated under irradiation by the photodiode electrically connected to the turned-off thin film transistor to drift under an effect of the bias voltage such that the bias voltage across the photodiode is reduced; in a third stage, sequentially supplying the first scanning signal to the plurality of gate lines again such that the thin film transistor electrically connected to the gate line to which the first scanning signal is applied is turned on, and charging, by the image signal processing circuit, the equivalent capacitor formed by the cathode and the anode of the photodiode electrically connected to the turned-on thin film transistor to the reference voltage.

BRIEF DESCRIPTION OF DRAWINGS

Hereinafter, exemplary embodiments of the present disclosure will be described in detail with respect to the accompanying drawings. It should be understood that embodiments described herein are merely for the purpose of illustration and explanation of the disclosure and should not be constructed as a limitation thereof. In the drawings:

FIG. 5 illustrates a flow chart of a method of operating an X-ray detecting panel according to an embodiment of the present disclosure.

DETAILED DESCRIPTION

Figure 1:
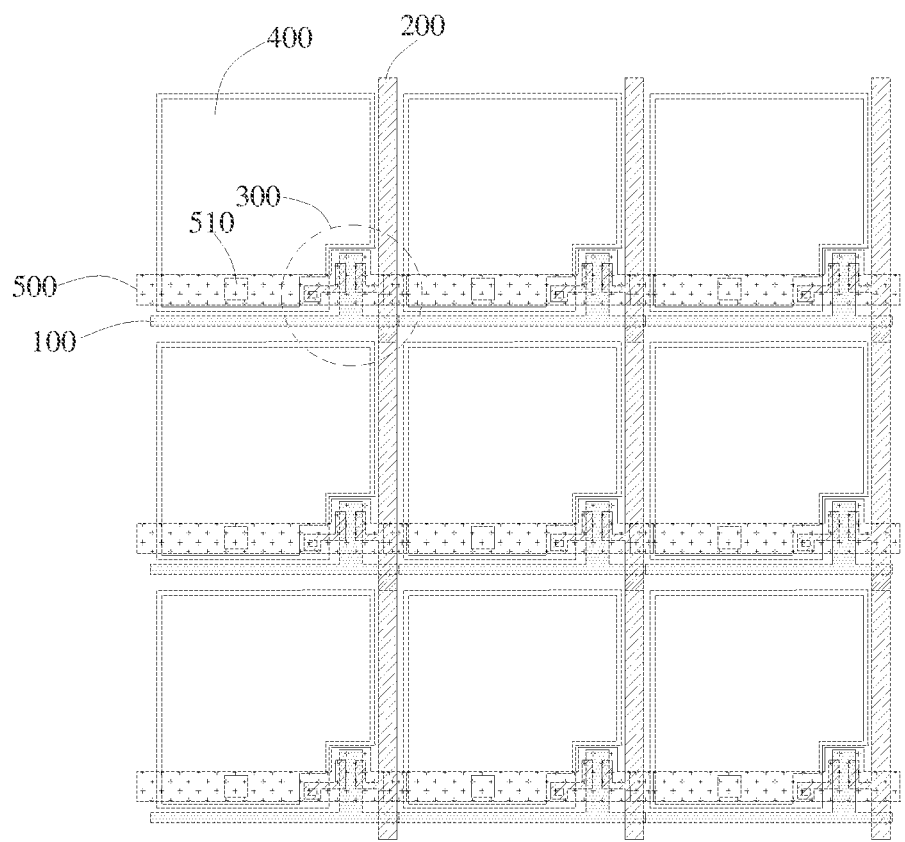
FIG. 1 is a schematic diagram showing an X-ray flat panel detector including an array substrate according to the related art.

FIG. 1 is a schematic diagram showing an X-ray flat panel detector including an array substrate according to the related art. As shown in FIG. 1, the array substrate includes a plurality of gate lines 100, a plurality of signal lines 200, and a plurality of bias voltage lines 500. The plurality of gate lines 100 and the plurality of signal lines 200 divide the array substrate into a plurality of photosensitive cells arranged in rows and columns. Each of the photosensitive cells comprises a thin film transistor 300. As shown in FIG. 1, each of the thin film transistors 300 in the array substrate is disposed at a lower right corner of a photosensitive cell comprising the thin film transistor 300. That is, for each photosensitive cell, the thin film transistor 300 thereof is at the same position in the photosensitive cell. For an X-ray flat panel detector, magnitude of a parasitic capacitance Cgd formed between a gate and a drain of the thin film transistor 300 determines noise magnitude of a detection signal output from a signal line 200 electrically connected to the drain of the thin film transistor 300, and magnitude of a parasitic capacitance Cgs formed between the gate and a source of the thin film transistor 300 determines uniformity of detection signals output from the signal line 200 electrically connected to the thin film transistor 300.

Since a device for manufacturing the array substrate has a limited precision, compared with a designed relative positional relationship (hereinafter referred to as "ideal state") between the source, the drain, and the gate of the thin film transistor 300, a an actual relative positional relationship between the actually formed source, drain, and gate of the thin film transistor 300 may have an offset with respect to the designed relative positional relationship. For a plurality of adjacent thin film transistors each of which is disposed at the same position in the photosensitive cell comprising the thin film transistor, when the plurality of thin film transistors are formed by a same process (for example, by an overlay process), same or similar thin film transistor manufacturing errors (i.e., in a same direction) are produced in different thin film transistors. In this case, the parasitic capacitance Cgd between the gate and the drain of each thin film transistor 300 has an offset toward a same direction as compared with the parasitic capacitance Cgd in the ideal state, and the parasitic capacitance Cgs between the gate and the source of each thin film transistor 300 also has an offset toward a same direction as compared with the parasitic capacitance Cgs in the ideal state. For example, in some cases, when the source and the drain of each thin film transistor 300 both have an offset toward the right, an area where the source overlaps with the gate is increased while an area where the drain overlaps with the gate is reduced, which results in the fact that the parasitic capacitance Cgd between the gate and the drain of each thin film transistor 300 is reduced, and the parasitic capacitance Cgs between the gate and the source of each thin film transistor 300 is increased. Accordingly, detection signals output from the signal lines 200 electrically connected to the respective thin film transistors 300 have offsets toward a first common direction. In some cases, when the source and the drain of each thin film transistor 300 both have an offset toward the left, the area where the source overlaps with the gate is reduced while the area where the drain overlaps with the gate is increased, which results in the fact that the parasitic capacitance Cgd between the gate and the drain of each thin film transistor 300 is increased, and the parasitic capacitance Cgs between the gate and the source of each thin film transistor 300 is reduced. Accordingly, the detection signals output from the signal lines 200 electrically connected to the respective thin film transistors 300 have offsets toward a second common direction which is opposite to the first common direction. Since the detection signals output from the signal lines 200 electrically connected to the respective thin film transistors 300 have offsets toward the same direction, a partial "whitening" or "blackening" phenomenon may occur on an image formed using detection signals of a current X-ray flat panel detector.

In the present disclosure, the partial "whitening" or "blackening" phenomenon on the image formed using detection signals of the X-ray flat panel detector refers to the case where: since there are thin film transistor manufacturing errors in the X-ray flat panel detector, gray scale values of at least part of the image are higher or lower than gray scale values of the at least part of the image when there is no thin film transistor manufacturing error in the X-ray flat panel detector.

The partial "whitening" or "blackening" phenomenon that occurs on the image may be alleviated by improving precision of the device for manufacturing the array substrate. For mass production however, improving precision of the device may greatly increase the production cost. In view of this, an array substrate is provided according to an embodiment of the present disclosure.

Figure 2:
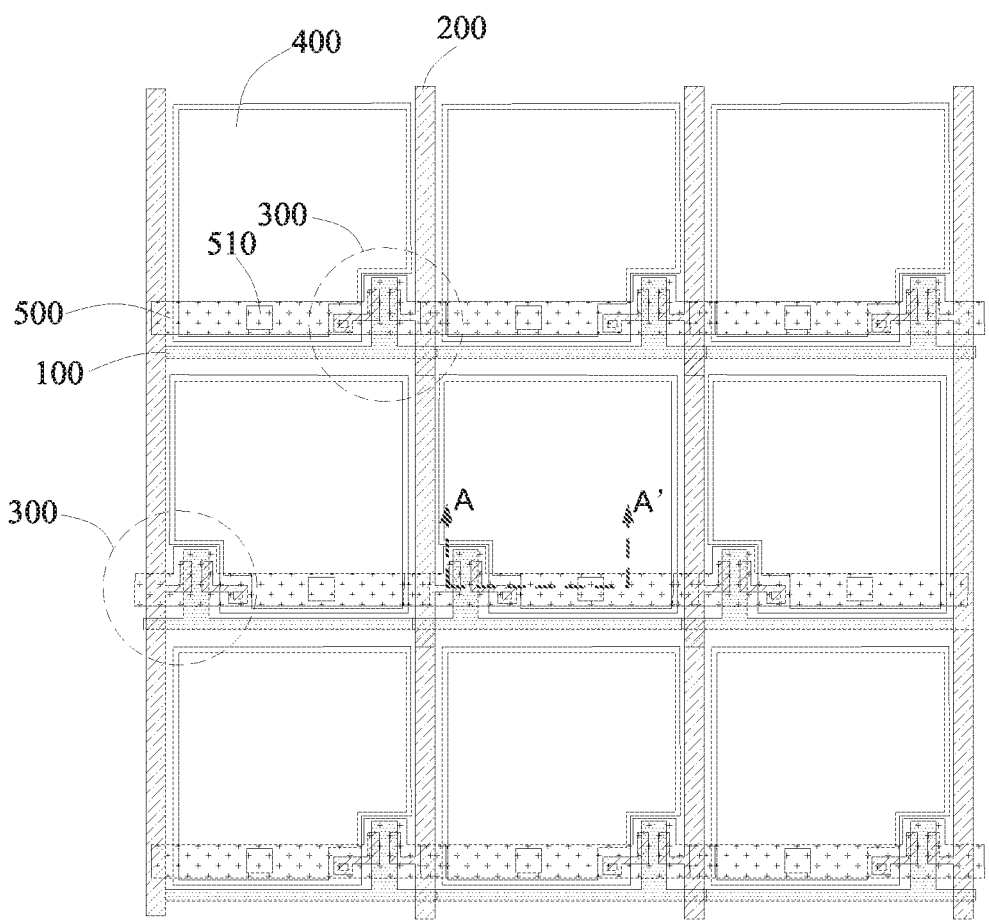
FIG. 2 is a schematic diagram showing an X-ray detecting panel including an array substrate according to an embodiment of the present disclosure.

FIG. 2 is a schematic diagram showing an X-ray detecting panel including an array substrate according to an embodiment of the present disclosure. An array substrate according to an embodiment of the present disclosure is illustrated in FIG. 2. As shown in FIG. 2, the array substrate includes a plurality of gate lines 100 and a plurality of signal lines 200 intersecting with the plurality of gate lines 100 to divide the array substrate into a plurality of photosensitive cells. In some embodiments, as shown in FIG. 2, the plurality of photosensitive cells are arranged in rows and columns, but the present disclosure is not limited thereto. In some embodiments, the plurality of gate lines and the plurality of signal lines may be not vertically intersected with each other, but be intersected with each other at a certain angle (for example, 45 degrees) to divide the array substrate into the plurality of photosensitive cells. Each photosensitive cell is provided with a thin film transistor 300 therein, and each thin film transistor 300 is disposed at a first side or a second side opposite to the first side of the photosensitive cell comprising the thin film transistor 30.

In some embodiments, as shown in FIG. 2, the first side of the photosensitive cell is the left side of the photosensitive cell, and the second side of the photosensitive cell is the right side of the photosensitive cell. However, the present disclosure is not limited thereto as long as the first side and the second side of the photosensitive cell are opposite sides of the photosensitive cell.

In some embodiments, as shown in FIG. 2, at least one thin film transistor 300 is disposed at the first side of the photosensitive cell comprising the thin film transistor 300, and at least one thin film transistor 300 is disposed at the second side of the photosensitive cell comprising the thin film transistor 300. In this case, as shown in FIG. 2, the drain of the thin film transistor 300 disposed at the first side of the photosensitive cell comprising the thin film transistor 300 is disposed at the first side of the thin film transistor 300, and is electrically connected to a signal line 200 which is located at the first side of the thin film transistor 300 and closest to the thin film transistor 300; and the drain of the thin film transistor 300 disposed at the second side of the photosensitive cell comprising the thin film transistor 300 is disposed at the second side of the thin film transistor 300, and is electrically connected to a signal line 200 which is located at the second side of the thin film transistor 300 and closest to the thin film transistor 300.

In some embodiments, as shown in FIG. 2, in at least one column of the photosensitive cells, at least one thin film transistors 300 is disposed at the left side of the photosensitive cell comprising the thin film transistor 300, and at least one thin film transistors 300 is disposed at the right side of the photosensitive cell comprising the thin film transistor 300. In this case, as shown in FIG. 2, the drain of the thin film transistor 300 disposed at the left side of the photosensitive cell comprising the thin film transistor 300 is disposed at the left side of the thin film transistor 300, and is electrically connected to a signal line 200 which is located at the left side of the thin film transistor 300 and closest to the thin film transistor 300; and the drain of the thin film transistor 300 disposed at the right side of the photosensitive cell comprising the thin film transistor 300 is disposed at the right side of the thin film transistor 300, and is electrically connected to a signal line 200 which is located at the right side of the thin film transistor 300 and closest to the thin film transistor 300.

It will be readily understood that the structure of the array substrate provided in the present disclosure can satisfy basic functions that an array substrate should have. In some embodiments, as shown in FIG. 2, each of the signal lines 200 extending in the column direction is electrically connected to only one of the thin film transistors 300 of each row of photosensitive cells.

In the array substrate according to the embodiments of the present disclosure, for convenience of description, the thin film transistor 300 disposed at the left side of the photosensitive cell comprising the thin film transistor 30 is referred as a left thin film transistor, and the thin film transistor 300 disposed at the right side of the photosensitive cell comprising the thin film transistor 30 is referred as a right thin film transistor.

During manufacture of the array substrate according to the embodiments of the present disclosure, in some cases, the parasitic capacitance Cgs between the source and the gate of the left thin film transistor is increased due to the thin film transistor manufacturing error, and the parasitic capacitance Cgd between the drain and the gate of the left thin film transistor is reduced due to the thin film transistor manufacturing error. At the same time, the parasitic capacitance Cgs between the source and the gate of the right thin film transistor is reduced and the parasitic capacitance Cgd between the drain and the gate of the right thin film transistor is increased due to the thin film transistor manufacturing error. However, the array substrate according to the embodiments of the present disclosure is not only applicable to the above cases, but is also applicable to, for example, the following cases. In some cases, the parasitic capacitance Cgs between the source and the gate of the left thin film transistor is reduced and the parasitic capacitance Cgd between the drain and the gate of the left thin film transistor is increased due to the thin film transistor manufacturing error. At the same time, the parasitic capacitance Cgs between the source and the gate of the right thin film transistor is increased and the parasitic capacitance Cgd between the drain and the gate of the right thin film transistor is reduced due to the thin film transistor manufacturing error.

After a light emitting element layer (including a plurality of photodiodes) and a scintillation layer are formed on the array substrate according to the embodiments of the present disclosure described above, an X-ray detecting panel according to an embodiment of the present disclosure can be obtained. During detecting X-rays, a gate driving circuit sequentially supplies scanning signals to the plurality of gate lines 100 such that the source and the drain of the thin film transistors corresponding to the gate lines 100 are sequentially turned on, and then an amount of photogenerated charge accumulated by the photodiodes due to the previously received irradiation is converted into X-ray intensity data by the plurality of signal lines 200 and a signal processing circuit connected with the plurality of signal lines 200.

As described above, in a column of photosensitive cells in which the left thin film transistor and the right thin film transistor are present, since the error of the parasitic capacitance Cgd in the left thin film transistor is opposite to that in the right thin film transistor (i.e., the parasitic capacitance Cgd in the left thin film transistor and the parasitic capacitance Cgd in the right thin film transistor have offsets in opposite directions), and the error of the parasitic capacitance Cgs in the left thin film transistor is opposite to that in the right thin film transistor (i.e., the parasitic capacitance Cgs in the left thin film transistor and the parasitic capacitance Cgs in the right thin film transistor have offsets in opposite directions), the detection signal output from the photosensitive cell corresponding to the left thin film transistor has an offset in an direction opposite to the direction of the offset of the detection signal output from the photosensitive cell corresponding to the right thin film transistor.

In some embodiments, in any two adjacent rows of photosensitive cells, the thin film transistors 300 in one row of photosensitive cells are respectively disposed at the left side of the photosensitive cells comprising the thin film transistors 300, while the thin film transistors 300 in the other row of photosensitive cells are respectively disposed at the right side of the photosensitive cells comprising the thin film transistors 300. For example, in some embodiments, as shown in FIG. 2, the thin film transistors 300 in odd rows of photosensitive cells are right thin film transistors, and the thin film transistors 300 in even rows of photosensitive cells are left thin film transistors.

Specifically, the errors of the parasitic capacitances Cgd in the thin film transistors 300 of the odd rows of photosensitive cells are opposite to the errors of the parasitic capacitances Cgd in the thin film transistors 300 of the even rows of photosensitive cells, and the errors of the parasitic capacitances Cgs in the thin film transistors 300 of the odd rows of photosensitive cells are opposite to the errors of the parasitic capacitances Cgs in the thin film transistors 300 of the even rows of photosensitive cells. Accordingly, the detection signals output from the odd rows of photosensitive cells to the signal lines 200 and the detection signals output from the even rows of photosensitive cells to the signal lines 200 have offsets in opposite directions. When an image is formed by using the detection signals obtained by the above described array substrate or X-ray detecting panel according to the embodiments of the present disclosure, since detection signals output from the photosensitive cells corresponding to the left thin film transistors have offsets in an direction opposite to the direction of the offsets of detection signals output from the photosensitive cells corresponding to the right thin film transistors, a mean value of gray scale values of an area (corresponding to the photosensitive cells in which the thin film transistors in the array substrate according to the embodiments of the present disclosure have offsets) of the formed image can be balanced, thereby alleviating the partial "whitening" or "blacking" phenomenon in the formed image, and improving quality of the formed image.

Figure 4:
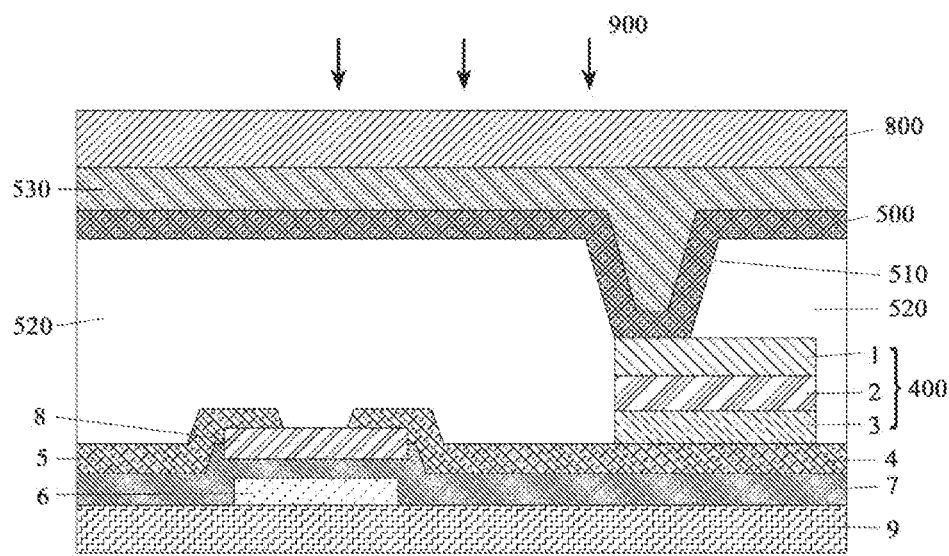
FIG. 4 illustrates an exemplary cross-sectional view of a structure taken along line A-A' of FIG. 2.

In the present disclosure, the specific structure of the photodiodes is not limited. In some embodiments, each of the photodiodes has a structure similar to a sandwich structure, i.e., each of the photodiodes has a P-type doped anode 1 as an upper layer, an N-type doped cathode 3 as a lower layer, and an intrinsic layer 2 therebetween, as shown in FIG. 4.

As shown in FIG. 2, the number (four shown in FIG. 2) of the signal lines 200 is greater than the number (three shown in FIG. 2) of columns of the photosensitive cells by one.

In order to improve the detection precision, the X-ray detecting panel generally has a high resolution. For example, in some embodiments, the array substrate according to an embodiment of the present disclosure includes 3072 gate lines and 3073 signal lines, such that the array substrate is divided into 3072×3072 photosensitive cells.

Figure 3:
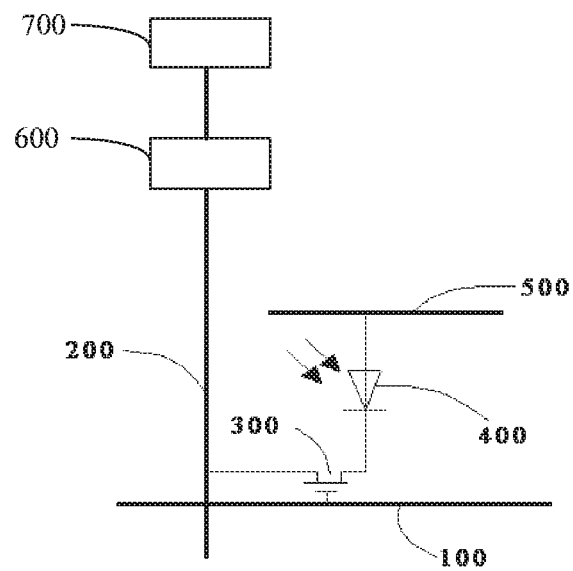
FIG. 3 shows a schematic circuit diagram of an X-ray detecting panel according to an embodiment of the present disclosure.

In an embodiment of the present disclosure, there is further provided an X-ray detecting panel including the above described array substrate according to the embodiments of the present disclosure. FIG. 3 is a circuit schematic diagram showing partial circuit of an X-ray detecting panel according to an embodiment of the present disclosure. As shown in FIGS. 2 to 4, the X-ray detecting panel according to an embodiment of the present disclosure further includes a photosensitive element layer, an insulating layer covering the photosensitive element layer 520, and a plurality of bias voltage lines 500 disposed on the insulating layer. The photosensitive element layer includes a plurality of photodiodes 400, and each of the plurality of photodiodes 400 corresponds to one photosensitive cell 400. As shown in FIGS. 2 to 4, the source 4 of the thin film transistor 300 in each photosensitive cell is electrically connected to the cathode 3 of the photodiode 400 corresponding to photosensitive cell, and a bias voltage line 500 corresponding to the photosensitive cell is electrically connected to the anode 1 of the photodiode 400 corresponding to the photosensitive cell through a via hole 510 in the insulating layer 520 corresponding to the photosensitive cell. In some embodiments, as shown in FIG. 2, each bias voltage line 500 corresponds to one row of photosensitive cells, and each via hole 510 corresponds to one photosensitive cell.

In some embodiments, as shown in FIG. 4, the thin film transistor 300 may include a source 4, a drain 5, a gate 6, a semiconductor layer 8, and a gate insulating layer 7 between the gate 6 and the semiconductor layer 8. Further, in some embodiments, as shown in FIG. 4, the thin film transistors 300, the photodiodes 400, the insulating layer 520, the bias voltage lines 500, the via holes 510, and the like in the X-ray detecting panel according to an embodiment of the present disclosure are located on a base 9.

Each of the bias voltage lines 500 is electrically connected to a bias voltage source (not shown) to provide a bias voltage to the anode of the photodiode 400 that is electrically connected to the bias voltage line 500. As an intensity of light irradiated on the photodiode 400 changes, the amount of the photogenerated charge accumulated on the photodiode 400 changes accordingly when the gate of the thin film transistor 300 electrically connected to the photodiode 400 is turned off, therefore the intensity of light irradiated on the photodiode 400 can be detected.

As described above, in the image formed by using the detection signals obtained by the above described X-ray detecting panel according to the embodiments of the present disclosure, the partial "whitening" or "blackening" phenomenon in the formed image due to the thin film transistor manufacturing errors can be effectively alleviated or even eliminated.

In order to enable the photodiode 400 to detect light, it is required to convert the X-rays that are irradiated on the X-ray detecting panel into light (e.g., visible light) that can be detected by the photodiode 400. In some embodiments, the X-rays are converted into visible light by a scintillation layer. Thus, in some embodiments, the X-ray detecting panel may include the scintillation layer. However, the present disclosure is not limited thereto. For example, in some embodiments, the X-ray detecting panel may not include the scintillation layer. In the case that the X-ray detecting panel does not include the scintillation layer, when a user uses the X-ray detecting panel, it is necessary to attach a commercially available scintillation layer to a light incident surface of the X-ray detecting panel in advance.

In some embodiments, as shown in FIG. 4, the X-ray detecting panel includes a scintillation layer 800, and the scintillation layer 800 is disposed on a light incident side of the photosensitive element layer to convert X-rays 900 into light that can be detected by the photodiode 400. In some embodiments, as shown in FIG. 4, a scintillation insulating layer 530 may be disposed between the scintillation layer 800 and the bias voltage line 500.

In the present disclosure, a material included in the scintillation layer is not limited. In some embodiments, the scintillation layer includes gadolinium oxysulfide. In some embodiments, the scintillation layer includes cesium iodide.

In some embodiments, the X-ray detecting panel is used in conjunction with a display device to convert detection signals output from the signal lines 200 of the X-ray detecting panel into an image signal. In some embodiments, the X-ray detecting panel further includes an image signal processing circuit 600. The image signal processing circuit 600 is electrically connected to the signal lines 200, receives detection signals from the photosensitive cells through the signal lines 200, and converts the received detection signals into an image signal.

In the X-ray detecting panel according to an embodiment of the present disclosure, the photodiode 400 is operated under a reverse bias voltage and may be partially used as a capacitor. The bias voltage line 500 provides a constant negative voltage to the anode of the photodiode 400.

In an Embodiment of the present disclosure, there is also provided a method of operating the above-described X-ray detecting panel.

As shown in FIG. 5, one operating cycle of the method of operating the X-ray detecting panel according to an embodiment of the present disclosure includes the following stages P1 to P3.

In the stage P1, a first scanning signal is sequentially supplied to the plurality of gate lines 100 such that the thin film transistor 300 electrically connected to the gate line 100 to which the first scanning signal is applied is turned on. In this case, the image signal processing circuit applies a positive voltage through the signal line 200 to the cathode of the photodiode 400 electrically connected to the turned-on thin film transistor 300, and charges an equivalent capacitor formed by the cathode and the anode of the photodiode 400 to a reference voltage. That is, the photodiode 400 has a bias voltage equal to the reference voltage.

In the stage P2, a second scanning signal is sequentially supplied to the plurality of gate lines 100 such that the thin film transistor 300 electrically connected to the gate line 100 to which the second scanning signal is applied is turned off. In this case, photogenerated charge under irradiation by the photodiode 400 electrically connected to the turned-off thin film transistor 300 drifts under an effect of the bias voltage (for example, photogenerated electrons drift to the cathode of the photodiode 400 under the effect of the bias voltage and neutralize positive charge near the cathode) such that the bias voltage across the photodiode 400 is reduced.

In the stage P3, the first scanning signal is sequentially supplied to the plurality of gate lines 100 again such that the thin film transistor 300 electrically connected to the gate line 100 to which the first scanning signal is applied is turned on. In this case, the image signal processing circuit charges the equivalent capacitor formed by the cathode and the anode of the photodiode 400 electrically connected to the turned-on thin film transistor 300 to the reference voltage again.

The amount of charges charged to the photodiode 400 during the stage P3 reflects the amount of photogenerated electrons neutralized in the above described stage P2, i.e., reflects the intensity of light irradiated on the photodiode 400. Therefore, the intensity of the X-rays irradiated on the X-ray detecting panel can be obtained.

In an embodiment of the present disclosure, there is further provided an X-ray detecting device. The X-ray detecting device includes the X-ray detecting panel according to the embodiments of the present disclosure described above, and a display panel 700. The display panel 700 is capable of displaying an image based on the image signal from the X-ray detecting panel.

When the X-rays are detected by the X-ray detecting panel according to the embodiments of the present disclosure described above, the X-ray detecting panel outputs detection signals reflecting the intensities of the X-rays, the detection signals are converted into an image signal, and the display panel displays an image according to the image signal. There is no, or a alleviated, partial "whitening" or "blackening" phenomenon in the display image, thereby improving an display effect of the image and facilitating a doctor or other professionals to determine according to the display image.

It should be understood that the above embodiments are merely exemplary embodiments for the purpose of illustrating the principle of the disclosure, and the disclosure is not limited thereto. Various modifications and improvements can be made by an ordinary skilled in the art without departing from the spirit and essence of the disclosure. Accordingly, all of the modifications and improvements also fall into the protection scope of the disclosure.

What is claimed is:

1. An X-ray detecting panel, comprising: an array substrate, the array substrate comprising: a plurality of gate lines and a plurality of signal lines intersecting with the plurality of gate lines to divide the array substrate into a plurality of photosensitive cells, wherein each of the plurality of photosensitive cells comprises a thin film transistor, and the plurality of photosensitive cells comprises one or more first photosensitive cells and one or more second photosensitive cells, the thin film transistor of each of the first photosensitive cells is disposed at a first side of the first photosensitive cell, the thin film transistor of each of the second photosensitive cells is disposed at a second side of the second photosensitive cell, and the first side is opposite to the second side, and the plurality of photosensitive cells are arranged in rows and columns, each of the plurality of photosensitive cells is included in one row of photosensitive cells and one column of photosensitive cells, all photosensitive cells in each row of photosensitive cells are arranged in a straight line in a row direction, all photosensitive cells in each column of photosensitive cells are arranged in a straight line in a column direction, each of the plurality of gate lines extends in the row direction, each of the plurality of signal lines extends in the column direction, all of the columns of the photosensitive cells and the plurality of signal lines are arranged alternately in the row direction, the number of columns of the photosensitive cells is less than the number of the signal lines by one, and each column of photosensitive cells is between adjacent two ones of the plurality of signal lines.

2. The X-ray detecting panel according to claim 1, wherein
a drain of the thin film transistor of the first photosensitive cell is disposed at the first side of the thin film transistor, and is electrically connected to a signal line at the first side of the thin film transistor and closest to the thin film transistor; and
a drain of the thin film transistor of the second photosensitive cell is disposed at the second side of the thin film transistor, and is electrically connected to a signal line at the second side of the thin film transistor and closest to the thin film transistor.

3. The X-ray detecting panel according to claim 2, further comprising a photosensitive element layer on the array substrate, an insulating layer covering the photosensitive element layer, and a plurality of bias voltage lines on the insulating layer,
wherein the photosensitive element layer comprises a plurality of photodiodes, and each of the plurality of photosensitive cells corresponds to one photodiode, a source of the thin film transistor in each of the photosensitive cells is electrically connected to a cathode of the photodiode corresponding to the photosensitive cell, and a bias voltage line corresponding to the photosensitive cell is electrically connected to an anode of the photodiode corresponding to the photosensitive cell through a via hole in the insulating layer corresponding to the photosensitive cell.

4. The X-ray detecting panel according to claim 3, wherein
each column of at least one column of the photosensitive cells comprises at least one of the first photosensitive cells and at least one of the second photosensitive cells, and in the column, the thin film transistor of the first photosensitive cell is disposed at the left side of the first photosensitive cell and the thin film transistor of the second photosensitive cell is disposed at the right side of the second photosensitive cell, a drain of the thin film transistor disposed at the left side of the first photosensitive cell is disposed at the left side of the thin film transistor, and is electrically connected to a signal line at the left side of the thin film transistor and closest to the thin film transistor, and a drain of the thin film transistor disposed at the right side of the second photosensitive cell is disposed at the right side of the thin film transistor, and is electrically connected to a signal line at the right side of the thin film transistor and closest to the thin film transistor.

5. The X-ray detecting panel according to claim 4, wherein in any two adjacent rows of photosensitive cells, the thin film transistors in one row of photosensitive cells are respectively disposed at the left side of the photosensitive cells comprising the thin film transistors, while the thin film transistors in the other row of photosensitive cells are respectively disposed at the right side of the photosensitive cells comprising the thin film transistors.

6. The X-ray detecting panel according to claim 5, wherein the thin film transistors in odd rows of photosensitive cells are disposed at the right side of the photosensitive cells comprising the thin film transistors, and the thin film transistors in even rows of photosensitive cells are disposed at the left side of the photosensitive cells comprising the thin film transistors.

7. The X-ray detecting panel according to claim 4, wherein the array substrate comprises 3072 gate lines and 3073 signal lines, such that the array substrate is divided into 3072×3072 photosensitive cells.

8. The X-ray detecting panel according to claim 3, wherein the X-ray detecting panel further comprises a scintillation layer disposed on a light incident side of the photosensitive element layer to convert X-rays into visible light.

9. The X-ray detecting panel according to claim 8, wherein the scintillation layer comprises gadolinium oxysulfide.

10. The X-ray detecting panel according to claim 8, wherein the scintillation layer comprises cesium iodide.

11. The X-ray detecting panel according to claim 3, wherein
the X-ray detecting panel further comprises an image signal processing circuit, and
the image signal processing circuit is electrically connected to the signal lines, receives detection signals from the photosensitive cells through the signal lines, and converts the received detection signals into an image signal.

12. An X-ray detecting device, comprising: the X-ray detecting panel according to claim 11, and a display panel configured to display an image based on the image signal from the X-ray detecting panel.

13. A method of operating the X-ray detecting panel according to claim 11, comprising:
in a first stage, sequentially supplying a first scanning signal to the plurality of gate lines such that the thin film transistor electrically connected to a gate line to which the first scanning signal is applied is turned on, applying, by the image signal processing circuit, a positive voltage through the signal line to the cathode of the photodiode electrically connected to the turned-on thin film transistor, and charging an equivalent capacitor formed by the cathode and the anode of the photodiode to a reference voltage such that the photodiode has a bias voltage equal to the reference voltage;
in a second stage, sequentially supplying a second scanning signal to the plurality of gate lines such that the thin film transistor electrically connected to a gate line to which the second scanning signal is applied are turned off, to cause photogenerated charge generated under irradiation by the photodiode electrically connected to the turned-off thin film transistor to drift under an effect of the bias voltage such that the bias voltage across the photodiode is reduced;
in a third stage, sequentially supplying the first scanning signal to the plurality of gate lines again such that the thin film transistor electrically connected to the gate line to which the first scanning signal is applied is turned on, and charging, by the image signal processing circuit, the equivalent capacitor formed by the cathode and the anode of the photodiode electrically connected to the turned-on thin film transistor to the reference voltage.

14. The method of operating the X-ray detecting panel according to claim 13, wherein
each column of at least one column of the photosensitive cells comprises at least one of the first photosensitive cells and at least one of the second photosensitive cells, and in the column, the thin film transistor of the first photosensitive cell is disposed at the left side of the first photosensitive cell and the thin film transistor of the second photosensitive cell is disposed at the right side of the second photosensitive cell, a drain of the thin film transistor disposed at the left side of the first photosensitive cell is disposed at the left side of the thin film transistor, and is electrically connected to a signal line at the left side of the thin film transistor and closest to the thin film transistor, and a drain of the thin film transistor disposed at the right side of the second photosensitive cell is disposed at the right side of the thin film transistor, and is electrically connected to a signal line at the right side of the thin film transistor and closest to the thin film transistor.

15. The method of operating the X-ray detecting panel according to claim 14, wherein in any two adjacent rows of photosensitive cells, the thin film transistors in one row of photosensitive cells are respectively disposed at the left side of the photosensitive cells comprising the thin film transistors, while the thin film transistors in the other row of photosensitive cells are respectively disposed at the right side of the photosensitive cells comprising the thin film transistors.

16. The method of operating the X-ray detecting panel according to claim 15, wherein the thin film transistors in odd rows of photosensitive cells are disposed at the right side of the photosensitive cells comprising the thin film transistors, and the thin film transistors in even rows of photosensitive cells are disposed at the left side of the photosensitive cells comprising the thin film transistors.

17. The method of operating the X-ray detecting panel according to claim 14, wherein the array substrate comprises 3072 gate lines and 3073 signal lines, such that the array substrate is divided into 3072×3072 photosensitive cells.

18. The method of operating the X-ray detecting panel according to claim 13, wherein the X-ray detecting panel further comprises a scintillation layer disposed on a light incident side of the photosensitive element layer to convert X-rays into visible light.

* * * * *